United States Patent
Holland et al.

(10) Patent No.: US 10,737,614 B2
(45) Date of Patent: Aug. 11, 2020

(54) SUN VISOR FOR A VEHICLE

(71) Applicant: JAGUAR LAND ROVER LIMITED, Warwickshire (GB)

(72) Inventors: Rachel Holland, Coventry (GB); Ashutosh Tomar, Coventry (GB)

(73) Assignee: JAGUAR LAND ROVER LIMITED, Whitley, Coventry (GB)

( * ) Notice: Subject to any disclaimer, the term of this patent is extended or adjusted under 35 U.S.C. 154(b) by 0 days.

(21) Appl. No.: 16/338,520

(22) PCT Filed: Oct. 6, 2017

(86) PCT No.: PCT/EP2017/075486
§ 371 (c)(1),
(2) Date: Apr. 1, 2019

(87) PCT Pub. No.: WO2018/065579
PCT Pub. Date: Apr. 12, 2018

(65) Prior Publication Data
US 2019/0232866 A1    Aug. 1, 2019

(30) Foreign Application Priority Data

| Oct. 7, 2016 | (GB) | 1617055.7 |
| Oct. 7, 2016 | (GB) | 1617056.5 |
| Oct. 7, 2016 | (GB) | 1617058.1 |
| Oct. 7, 2016 | (GB) | 1617061.5 |

(51) Int. Cl.
*B60Q 3/252* (2017.01)
*H04N 7/18* (2006.01)
(Continued)

(52) U.S. Cl.
CPC ............ *B60Q 3/252* (2017.02); *B60J 3/0204* (2013.01); *B60J 3/0278* (2013.01); *B60J 3/0282* (2013.01);
(Continued)

(58) Field of Classification Search
CPC . B60Q 3/252; B60Q 3/66; B60Q 3/74; B60Q 3/745; B60Q 3/80; B60Q 3/20;
(Continued)

(56) References Cited

U.S. PATENT DOCUMENTS 4,792,884 A    12/1988 Suman et al.
5,011,211 A *   4/1991 Svensson ............... B60J 3/0282
                                                        296/97.1
(Continued)

FOREIGN PATENT DOCUMENTS

CZ        20050440 A3    2/2007
DE    102004059741 A1    4/2006
(Continued)

OTHER PUBLICATIONS

Combined Search and Examination Report under Sections 17 and 18(3) for Application No. GB1716351.0 dated Mar. 9, 2018.
(Continued)

*Primary Examiner* — Haissa Philogene
(74) *Attorney, Agent, or Firm* — Carlson, Gaskey & Olds

(57) ABSTRACT

The present invention relates to a sun visor (1) for a vehicle (100). The sun visor comprises a light source (6, 7) for providing illumination within the vehicle, and a printed electronic circuit (4) located within the sun visor for controlling operation of the light source. The sun visor may include a light dispersion device (10) for dispersing light emitted by the light source, which may include a body portion (11) extending over the printed electronic circuit and a light emission portion (12) extending around the body portion and arranged to transmit light from the light source to the outside of the sun visor.

20 Claims, 4 Drawing Sheets

(51) Int. Cl.
  *B60Q 1/00* (2006.01)
  *H05K 5/00* (2006.01)
  *B60Q 3/74* (2017.01)
  *B60J 3/02* (2006.01)
  *B60Q 3/76* (2017.01)
  *H05B 45/20* (2020.01)
  *H05B 47/11* (2020.01)
  *H05B 47/105* (2020.01)
  *B60Q 3/80* (2017.01)
  *F21V 8/00* (2006.01)

(52) U.S. Cl.
  CPC .............. *B60Q 3/74* (2017.02); *B60Q 3/745* (2017.02); *B60Q 3/76* (2017.02); *B60Q 3/80* (2017.02); *H05B 45/20* (2020.01); *H05B 47/105* (2020.01); *H05B 47/11* (2020.01); *H05K 5/0034* (2013.01); *G02B 6/0073* (2013.01); *Y02B 20/46* (2013.01)

(58) Field of Classification Search
  CPC ...... B60J 3/0204; B60J 3/0278; B60J 3/0282; H05B 33/086; H05B 37/02; H05B 37/0218; H05B 37/0227; H04N 5/23216; H04N 5/2256; H04N 5/2257; H04N 7/18; H04N 7/183; H04N 7/185; B60R 1/00; B60R 1/12; B60R 1/04; B60R 2011/0035; B60R 2001/1269
  See application file for complete search history.

(56) References Cited

U.S. PATENT DOCUMENTS

| | | | |
|---|---|---|---|
| 6,158,867 A | 12/2000 | Parker et al. | |
| 6,543,832 B1* | 4/2003 | Bogdanski | B60J 3/0208 296/97.1 |
| 7,825,600 B2* | 11/2010 | Stam | B60Q 1/085 315/82 |
| 8,976,247 B1* | 3/2015 | Karner | G08G 1/165 348/148 |
| 9,193,298 B2* | 11/2015 | Huelke | B60Q 3/80 |
| 9,238,433 B2* | 1/2016 | Stakoe | B60J 3/0282 |
| 9,457,642 B2* | 10/2016 | Kothari | B60R 1/00 |
| 9,609,222 B1* | 3/2017 | Rowles | G06F 3/0317 |
| 10,057,989 B1* | 8/2018 | Heikkinen | H05K 1/189 |
| 2005/0281041 A1 | 12/2005 | Kaphengst et al. | |
| 2006/0181893 A1 | 8/2006 | Fernandez et al. | |
| 2009/0154182 A1 | 6/2009 | Veenstra et al. | |
| 2014/0226289 A1 | 8/2014 | VanHouten et al. | |
| 2014/0265841 A1 | 9/2014 | Baek | |
| 2015/0145408 A1 | 5/2015 | Kuroda | |
| 2015/0217683 A1 | 8/2015 | Salter et al. | |
| 2015/0298603 A1 | 10/2015 | Salter et al. | |
| 2015/0360605 A1 | 12/2015 | Lanser et al. | |
| 2016/0082888 A1 | 3/2016 | Kothari | |
| 2016/0167490 A1 | 6/2016 | Janowiak et al. | |
| 2017/0217365 A1* | 8/2017 | Janowiak | B60Q 3/64 |
| 2019/0217781 A1* | 7/2019 | Tomar | B60J 3/0204 |

FOREIGN PATENT DOCUMENTS

| | | |
|---|---|---|
| DE | 102012015039 A1 | 1/2014 |
| JP | 2010269737 A | 12/2010 |

OTHER PUBLICATIONS

International Search Report and Written Opinion of the International Searching Authority for International application No. PCT/EP2017/075486 dated Jan. 24, 2018.

Combined Search and Examination Report under Sections 17 and 18(3) for Application No. GB1617055.7 dated Apr. 3, 2017.

* cited by examiner

Worked Example

SUN VISOR FOR A VEHICLE

TECHNICAL FIELD

The present disclosure relates to a sun visor for a vehicle. Aspects of the invention relate to a sun visor, to a light emitting system for a sun visor, to a vehicle comprising a sun visor, to a method of manufacturing a sun visor, and to a control module for controlling the lighting provided by a sun visor.

BACKGROUND

Most road vehicles are provided with deployable sun visors located above the main windshield in front of the driver seat and the front passenger seat. Known sun visors typically include a lighting system located adjacent to a vanity mirror that is switched on automatically when the mirror is exposed or operated via a switch. In certain circumstances glare may be caused by lighting elements of these sun visors and there may be insufficient or unsuitable lighting for certain use conditions. In addition, it is generally necessary for the lighting elements to be controlled by an electronic control unit (ECU) located outside the sun visor, which adds to the weight, cost and complexity of the lighting system, and in some vehicles poses a restriction to providing a lit vanity mirror altogether. In addition, sun visors including integrated electronic control systems tend to include a large number of separate components, and can therefore be time consuming and expensive to manufacture.

It is an aim of the present invention to address disadvantages associated with the prior art.

SUMMARY OF THE INVENTION

Aspects and embodiments of the invention provide a sun visor, a light emitting system for a sun visor, and a vehicle comprising a sun visor as claimed in the appended claims.

According to an aspect of the present invention there is provided a sun visor for a vehicle, the sun visor comprising a light source and at least one electronic component for controlling the lighting provided by the sun visor, wherein the at least one electronic component is a printed electronic component that is printed on a structural component of the sun visor. Since the lighting provided by the sun visor is controlled by an integral control system located within the sun visor it may not be necessary to provide a separate control module or ECU located outside the sun visor for controlling visor lighting, and control of the sun visor can instead be at least substantially self-contained. In addition, since the electronic component(s) are printed on a structural component of the sun visor it is not necessary to include separately manufactured circuit boards in the sun visor. In this way the invention minimises the cost, parts count, complexity and assembly time for the sun visor and a vehicle including the sun visor, and allows a simple, compact and rugged sun visor construction.

The printed electronic component(s) may comprise active and passive electronic components, each of which may be printed on the structural component, for example by a screen printing process, or alternatively by another known electronic component printing process. The printed electronic components may form a printed electronic circuit or printed control module. The printed electronic circuit or printed control module may include at least one processor and at least one memory module, and may include multiple layers of printed electronic components. The printed electronic components may be connected to each other and to the light source by printed tracks or wires.

The light source may include at least one light emitting element, for example at least one LED or OLED. The light emitting element(s) may be printed on the structural component of the sun visor. Alternatively the light emitting element(s) may be formed separately to the structural component and subsequently mounted to the structural component, or to another component of the sun visor.

The structural component may be a cover of the sun visor. For example, the structural component may be a rear cover of the sun visor (forming the surface of the sun visor that faces towards the interior of the vehicle when the sun visor is in a stowage position), or a front cover of the sun visor (forming the surface of the sun visor that faces towards a user when the sun visor is in a deployed position). Where the structural component is a cover of the sun visor the structural component may be provided with an outer trim layer or an electrochromic outer layer. Alternatively the structural component may be an internal structural component that is disposed between separate front and rear cover components. The structural component may be a moulded plastics component.

The sun visor may comprise a light dispersion device configured to disperse light emitted by the light source. By providing a light dispersion device configured to disperse light emitted by the light source it is possible to achieve more consistent and uniform lighting with reduced glare. The light source may in some cases be embedded in the light dispersion device, which may allow more efficient transmission of light into the light dispersion device.

The light dispersion device may be moulded, for example injection moulded, directly onto the structural component, the light source and/or the at least one electronic component. It will be appreciated that moulding the light dispersion device directly onto the structural component, the light source and/or the at least one electronic component means that the light dispersion device is moulded into its final shape in-situ against the structural component, the light source and/or the at least one electronic component. In some cases there may be a thin layer such as a protective coating between the light dispersion device and at least part of the structural component, the light source and/or the at least one electronic component. Alternatively the light dispersion device may be manufactured separately and then assembled together with the structural component.

The light source and/or the at least one electronic component may be embedded in the light dispersion device.

The light dispersion device may comprise a body portion that is configured to receive light emitted by the light source. The body portion may be at least substantially sheet-like. The body portion may be formed as a single continuous sheet.

The body portion of the light dispersion device may be located adjacent to the structural component, the light source and/or the at least one electronic component. The body portion may optionally be located directly adjacent to the structural component, the light source and/or the at least one electronic component, although in other cases the body portion may be separated from the structural component, the light source and/or the at least one electronic component by a thin layer such as a protective coating film or by a layer of adhesive. The light source and/or the at least one electronic component may be embedded in the body portion. The body portion may at least substantially cover the printed electronic circuit.

The light dispersion device may comprise a light emission portion that is configured to transmit light emitted by the light source to the outside of the sun visor. The light emission portion may be configured to transmit light emitted by the light source to the outside of the sun visor through an end face of the light emission portion. The light emission portion may be configured to act as a wave guide for directing light towards the outside of the sun visor.

The body portion may be configured to transfer light emitted by the light source to the light emission portion. Alternatively the light emission portion may be configured to receive light emitted by the light source directly, in which case a separate body portion for receiving light and transferring light to the light emission portion is not necessary.

The light emission portion of the light dispersion device may be integrally formed with the body portion (that is as a single monolithic component). The light emission portion may extend outwardly from the plane of the body portion, optionally in a direction substantially perpendicular to the plane of the body portion. The light emission portion of the light dispersion device may be joined to the body portion by a transition region. The transition region may have a shape that is curved or angled out from the plane of the body portion. A curved or angled transition region may allow more efficient transfer of light from the body portion to the light emission portion. The curved or angled transition region may be arranged to not disrupt total internal reflection of light within the transition region. The transition region may comprise a reflective surface. The reflective surface may act to increase the efficiency of transfer of light from the body portion to the light emission portion.

The light emission portion of the light dispersion device may be located at or adjacent to at least one edge of the sun visor. By locating the light emission portion at or adjacent to the edge of the sun visor it may be possible to minimise visual distraction caused by the light emitting system, especially when a user looks at a mirror located towards the centre of the sun visor. In this arrangement, the light emission portion may be in a spaced apart relationship with respect to the mirror. The light emission portion may form a loop extending around the sun visor. The loop may be at least substantially continuous, and may run along one or more edges of the sun visor. The light emission portion may extend along at least one edge of the body portion.

The light emission portion of the light dispersion device may be configured to focus the light transmitted to the outside of the sun visor. For example, the light emission portion may be configured to act as a lens to focus the light transmitted to the outside of the sun visor. The light emission portion may, for example, include a curved outer surface for focussing the light transmitted to the outside of the sun visor, although other shapes are also possible. By focussing the light it may be possible to reduce any visual distraction provided by the integrated light emitting system.

The light dispersion device may be formed of acrylic, polycarbonate, polyvinyl butyral (PVB) or glass. Other materials are also possible. The light dispersion device may be formed of a thermo-plastic or thermo-setting polymer.

At least a portion of the light dispersion device may be provided with a coating for preventing leakage of light from the light dispersion device. The coating may have a lower refractive index than the material of the light dispersion device. The coating may be provided on one or both sides of the body portion of the light dispersion device and/or around at least a portion of an outer edge surface of the light emission portion of the light dispersion device. The outer edge surface of the light emission portion may alternatively or additionally be covered by a covering that wraps around the edge of the sun visor.

The light dispersion device may be configured to internally reflect light emitted by the light source, optionally with total internal reflection.

The light dispersion device may be at least substantially invisible from the outside of the sun visor when the light source is not being operated. In some cases the light dispersion device may be covered by a first surface cover, which may be an electrochromic cover.

The sun visor may comprise a vanity mirror. The vanity mirror may be located adjacent to the light emission portion of the light dispersion device and/or may be surrounded by the light emission portion of the light dispersion device. In some cases the mirror may be covered by a first surface cover, which may be an electrochromic cover.

The at least one electronic component may be configured to control any one or more of the colour, colour temperature, CRI (colour rendering index), intensity, illuminance, brightness and distribution of light transmitted to the exterior of the sun visor. Controlling the distribution of lighting may comprise varying the regions of the sun visor from which light is transmitted, varying lighting provided by specific regions and/or varying the direction in which light is transmitted. Colour, colour temperature, CRI, intensity, illuminance, brightness and distribution of lighting may be controlled by controlling the light source, for example by switching light emitting elements of different colours or at different locations on and off and/or by controlling the intensity of light emitted by different light emitting elements. Alternatively, or in addition, the colour, colour temperature, CRI, intensity, illuminance, brightness and distribution of lighting may be controlled by controlling an electrochromic cover or other filter element.

The sun visor may comprise at least one sensor, and the at least one electronic component may be configured to control the lighting provided by the sun visor (for example by controlling the colour, colour temperature, CRI, intensity, illuminance, brightness and/or distribution of lighting) in dependence on an output of the at least one sensor. The sensor may be, for example, a light sensor, a temperature sensor, or a camera (occupant facing and/or forward facing). Alternatively, or in addition, the at least one electronic component may be configured to control the lighting provided by the sun visor in dependence on an output of at least one sensor provided elsewhere in the vehicle, for example on a vehicle dashboard or pillar.

The at least one electronic component may be configured to control the lighting provided by the sun visor in dependence on any one or more of: light conditions inside the vehicle, light conditions outside the vehicle, temperature inside the vehicle, temperature outside the vehicle, weather conditions, time, date, calendar event, vehicle location and planned destination. In this way the sun visor may be able to provide optimised lighting for different possible use conditions. Light conditions inside and/or outside the vehicle may be measured by a light sensor or camera provided in the sun visor, or alternatively communicated to the sun visor by a control system external to the sun visor either wirelessly or via a wired connection. Temperature, weather, time, date, calendar, location and destination information may be communicated to the sun visor by one or more control systems external to the sun visor either wirelessly or via a wired connection.

The at least one electronic component may be configured to control the lighting provided by the sun visor in dependence on vehicle occupancy. In this way the sun visor may be able to provide personalised lighting for different users of the vehicle. Occupancy information may be determined independently by the sun visor, for example based on images obtained by a camera provided in the sun visor, or based on the detection of a portable device associated with a particular user. Alternatively occupancy information may be communicated to the sun visor by a control system external to the sun visor.

The at least one electronic component may be configured to store user profiles for different users of the vehicle, and to control the lighting provided by the sun visor in dependence on the profile of a detected user. The user profiles may include personal lighting preferences such as brightness and colour temperature for each user, which may be set manually by the user (for example via a portable device or infotainment system) and/or automatically generated based on settings previously applied by the user (as part of a self-learning system). In some cases the user profiles may include information related to a user's face, for example face shape and/or skin tone, which may be used in determining what lighting should be provided for that user. The user profiles may further include recognition information for enabling recognition of a user (for example based on facial characteristics of the user or detection of a portable device associated with that user).

In one particular example the at least one electronic component may be configured to control the lighting provided by the sun visor in dependence on vehicle occupancy (in accordance with a user's profile) in combination with light conditions inside and/or outside the vehicle.

The at least one electronic component may be configured to control the lighting provided by the sun visor in dependence on any one or more of: the head position, face direction, eye direction and/or face shape of a user. For example, the at least one electronic component may be configured to control the distribution of lighting in dependence on the head position, face direction, eye direction and/or face shape of a user. In this way the sun visor may be able to provide optimised lighting for looking in a mirror provided on the sun visor with the desired areas of a user's face being adequately illuminated.

The at least one electronic component may be configured to control the lighting provided by the sun visor in dependence on the skin tone of a user. For example, the at least one electronic component may be configured to control colour, colour temperature, CRI, intensity, illuminance and/or brightness in dependence on the skin tone of a user. In this way the sun visor may be able to provide accurate and familiar lighting that is appropriate for a user's skin tone.

In some embodiments the sun visor may comprise a camera and the at least one electronic component may be configured to determine the head position, face direction, eye direction, face shape and/or skin tone of a user. Alternatively the head position, face direction, eye direction, face shape and/or skin tone of a user may be determined by a separate control module at another location within the vehicle and communicated to the sun visor either wirelessly or via a wired connection. Information relating to face shape and/or skin tone may also be stored as part of a user's profile.

Information relating to the head position, face direction, eye direction, face shape and/or skin tone of a user may be used in combination with other information relating to, for example, light conditions, weather conditions, time, date, calendar event, vehicle location, planned destination and/or vehicle occupancy in determining what lighting should be provided by the sun visor. In one particular example the at least one electronic component may be configured to control colour, colour temperature, CRI, intensity, illuminance and/or brightness in dependence on the skin tone of a user in combination with light conditions and/or vehicle occupancy, optionally while also controlling the distribution of lighting in dependence on the detected head position, face direction, eye direction and/or face shape of the user.

The at least one electronic component may be configured to control the lighting provided by the sun visor in dependence on a user selected setting. In some embodiments the sun visor may include one or more control elements such as a touch screen, a physical or capacitive switch, a gesture detection device and/or a microphone via which it is possible to manually control the lighting provided by the sun visor. Alternatively, or in addition, the light settings may be controlled via an external device such as the vehicle's infotainment system.

The at least one electronic component may be configured to control the lighting provided by the sun visor in dependence on the movement state of the vehicle. For example, the at least one electronic component may be configured to change the colour of light emitted by the light source and/or to reduce the intensity of light emitted by the light source or to switch the light source off if the vehicle begins to move or exceeds a certain speed.

The at least one electronic component may be configured to control the lighting provided by the sun visor in dependence on detected movement of a vehicle in front of the vehicle to which the sun visor is fitted and/or in dependence on a detected change in a traffic light state. For example, the at least one electronic component may be configured to change the colour of light emitted by the light source and/or to reduce the intensity of light emitted by the light source or to switch the light source off if it is determined that a vehicle in front of the vehicle to which the sun visor is fitted has begun to drive away or if it is determined that a traffic light has changed to green.

The sun visor may be configured to provide ambient lighting within a cabin of the vehicle, optionally while in a stowage position adjacent to the roof of the vehicle.

According to a further aspect of the present invention there is provided a sun visor for a vehicle, the sun visor comprising a light source and a moulded layer. The sun visor may further comprise at least one electronic component for controlling the lighting provided by the sun visor, although in other embodiments the lighting provided by the sun visor may be controlled by a separate control module external to the sun visor. The moulded layer may be moulded directly onto the light source and/or the at least one electronic component. It will be appreciated that the moulded layer being moulded directly onto the light source and/or the at least one electronic component means that the moulded layer is moulded into its final shape in situ against the light source and/or the at least one electronic component. The light source and/or the at least one electronic component may be embedded in the moulded layer. In some cases there may be a thin layer such as a protective coating between the moulded layer and the light source and/or the at least one electronic component. The sun visor may include any of the features described above in relation to earlier aspects of the present invention.

The light source and/or the at least one electronic component may be provided on a component-carrying member. In some embodiments the light source and/or the at least one electronic component may be printed on the component-carrying member, although in other embodiments the light source and/or the at least one electronic component may be manufactured separately prior to assembly together with the component-carrying member. The moulded layer may be moulded directly onto the component-carrying member.

The moulded layer may be fused together with the component-carrying member, for example during moulding of the moulded layer. In this way the component-carrying member and the moulded layer may together form a single unitary structure. It may appear in the final product that the light source and/or the at least one electronic component are suspended within the unitary structure.

The component-carrying member may be pre-moulded into its final shape prior to assembly together with the moulded layer. Alternatively the component-carrying member may be moulded together with the moulded layer.

The moulded layer may be injection moulded onto the component-carrying member, the light source and/or the at least one electronic component. Alternatively the moulded layer may be pre-formed prior to assembly together with the component-carrying member, the light source and/or the at least one electronic component, before being moulded into its final shape against the component-carrying member, the light source and/or the at least one electronic component.

The component-carrying member may be a structural component of the sun visor. Alternatively, or in addition, the component-carrying member may be a light dispersion device.

The moulded layer may be a light dispersion device configured to disperse light emitted by the light source. Alternatively, or in addition, the moulded layer may be a structural component of the sun visor.

According to a further aspect of the present invention there is provided a vehicle comprising a sun visor as described above. The vehicle may be an automotive vehicle, for example a car.

According to a further aspect of the present invention there is provided a light emitting system for a vehicle sun visor, the light emitting system comprising a light source and a printed electronic circuit configured to control the light source. The light emitting system may include any of the features described above in relation to earlier aspects of the present invention.

According to a further aspect of the present invention there is provided a method of manufacturing a sun visor for a vehicle, the method comprising providing a structural component of the sun visor, and printing at least one electronic component for controlling the lighting provided by the sun visor on the structural component. The at least one electronic component may be printed using a screen printing technique. Alternatively, the at least one electronic component may be printed using another technique, for example a flexographic printing, gravure, offset lithography, inkjet printing, laser printing or aerosol deposition technique.

The structural component may be a cover of the sun visor. The cover may be a front cover or a rear cover of the sun visor. Alternatively the structural component may be an internal structural component that is disposed between front and rear covers.

The method may further comprise printing at least one light emitting element, for example at least one LED or OLED, forming part of a light source on the structural component.

The method may further comprise moulding a light dispersion device for dispersing light emitted by a light source of the sun visor directly onto the structural component, the at least one electronic component and/or the light source.

According to a further aspect of the present invention there is provided a method of manufacturing a sun visor for a vehicle, the method comprising providing a light source, and moulding a moulded layer directly onto the light source and/or at least one electronic component for controlling the lighting provided by the sun visor.

The above-described methods may be used in manufacturing a sun visor including any of the features described above in connection with earlier aspects of the present invention.

According to a further aspect of the present invention there is provided a control module or control system for controlling the lighting provided by a sun visor. The control module may include at least one processor and at least one memory module, which may be configured to store criteria for applying different lighting regimes for the sun visor. The control module may optionally be formed by one or more printed electronic components, which may be printed on a structural component of the sun visor. However, in other embodiments the control module may be formed by one or more electronic components that are manufactured separately to the remaining components of the sun visor prior to assembly together with the remaining components of the sun visor. In still further embodiments the control module may be located outside the sun visor at another location within the vehicle. In some embodiments the processors and memory modules forming the control module may be split across a plurality of locations, including a first location in the sun visor and a second location outside the sun visor.

The control module may be configured to control the lighting provided by the sun visor by controlling any one or more of the colour, colour temperature, CRI (colour rendering index), intensity, illuminance, brightness and distribution of light transmitted to the exterior of the sun visor. Controlling the distribution of lighting may comprise varying the regions of the sun visor from which light is transmitted, varying lighting provided by specific regions and/or varying the direction in which light is transmitted. Colour, colour temperature, CRI, intensity, illuminance, brightness and distribution of lighting may be controlled by controlling a light source, for example by switching light emitting elements of different colours or at different locations on and off and/or by controlling the intensity of light emitted by different light emitting elements. Alternatively, or in addition, the colour, colour temperature, CRI, intensity, illuminance, brightness and distribution of lighting may be controlled by controlling an electrochromic cover or other filter element.

The control module may be configured to control the lighting provided by the sun visor in dependence on the skin tone of a user. For example, the control module may be configured to control colour, colour temperature, CRI, intensity, illuminance and/or brightness in dependence on the skin tone of a user. In this way the sun visor may be able to provide accurate and familiar lighting that is appropriate for a user's skin tone.

The control module may be configured to control the lighting provided by the sun visor in dependence on any one or more of: the head position, face direction, eye direction and/or face shape of a user. For example, the control module may be configured to control the distribution of lighting in dependence on the head position, face direction, eye direction and/or face shape of a user. In this way the sun visor may be able to provide optimised lighting for looking in a mirror provided on the sun visor with the desired areas of a user's face being adequately illuminated.

The control module may be configured to determine the head position, face direction, eye direction, face shape and/or skin tone of a user, for example based on images obtained by a camera provided in the sun visor or alternatively at another location within the vehicle. Information relating to face shape and/or skin tone may also be stored as part of a user's profile.

The control module may be configured to control the lighting provided by the sun visor in dependence on any one or more of: light conditions inside the vehicle, light conditions outside the vehicle, temperature inside the vehicle, temperature outside the vehicle, weather conditions, time, date, calendar event, vehicle location and planned destination. In this way the sun visor may be able to provide optimised lighting for different possible use conditions. Light conditions inside and/or outside the vehicle may be measured by a light sensor or camera provided in the sun visor or alternatively at another location within the vehicle.

The control module may be configured to control the lighting provided by the sun visor in dependence on vehicle occupancy. In this way the sun visor may be able to provide personalised lighting for different users of the vehicle. Occupancy information may be determined independently by the control module, for example based on images obtained by a camera provided in the sun visor or elsewhere in the vehicle, or based on the detection of a portable device associated with a particular user. Alternatively occupancy information may be communicated to the control module by a separate control system.

The control module may be configured to store user profiles for different users of the vehicle, and to control the lighting provided by the sun visor in dependence on the profile of a detected user. The user profiles may include personal lighting preferences such as brightness and colour temperature for each user, which may be set manually by the user (for example via a portable device or infotainment system) and/or automatically generated based on settings previously applied by the user (as part of a self-learning system). In some cases the user profiles may include information related to a user's face, for example face shape and/or skin tone, which may be used in determining what lighting should be provided for that user. The user profiles may further include recognition information for enabling recognition of a user (for example based on facial characteristics of the user or detection of a portable device associated with that user).

Information relating to vehicle occupancy may be used in combination with other information relating to, for example, light conditions, weather conditions, time, date, calendar event, vehicle location and/or planned destination in determining what lighting should be provided by the sun visor. In one particular example the control module may be configured to control the lighting provided by the sun visor in dependence on vehicle occupancy (in accordance with a user's profile) in combination with light conditions inside and/or outside the vehicle.

Information relating to the head position, face direction, eye direction, face shape and/or skin tone of a user may be used in combination with other information relating to, for example, light conditions, weather conditions, time, date, calendar event, vehicle location, planned destination and/or vehicle occupancy in determining what lighting should be provided by the sun visor. In one particular example the control module may be configured to control colour, colour temperature, CRI, intensity, illuminance and/or brightness in dependence on the skin tone of a user in combination with light conditions and/or vehicle occupancy (in accordance with a user's profile), optionally while also controlling the distribution of lighting in dependence on the detected head position, face direction, eye direction and/or face shape of the user.

The control module may be configured to control the lighting provided by the sun visor in dependence on a user selected setting. In some embodiments the sun visor may include one or more control elements such as a touch screen, a physical or capacitive switch, a gesture detection device and/or a microphone via which it is possible to manually control the lighting provided by the sun visor. Alternatively, or in addition, the light settings may be controlled via an external device such as the vehicle's infotainment system.

The control module may be configured to control the lighting provided by the sun visor in dependence on the movement state of the vehicle. For example, the control module may be configured to change the colour of light emitted by the light source and/or to reduce the intensity of light emitted by the light source or to switch the light source off if the vehicle begins to move or exceeds a certain speed.

The control module may be configured to control the lighting provided by the sun visor in dependence on detected movement of a vehicle in front of the vehicle to which the sun visor is fitted and/or in dependence on a detected change in a traffic light state. For example, the control module may be configured to change the colour of light emitted by the light source and/or to reduce the intensity of light emitted by the light source or to switch the light source off if it is determined that a vehicle in front of the vehicle to which the sun visor is fitted has begun to drive away or if it is determined that a traffic light has changed to green.

The control module may be a control module for controlling a sun visor including any of the features described above in connection with earlier aspects of the present invention. The control module may be configured to control the lighting provided by the sun visor in any of the ways described above in connection with earlier aspects of the present invention. The control module may be configured to perform any of the function described above in connection with the at least one electronic component.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Figure 1:
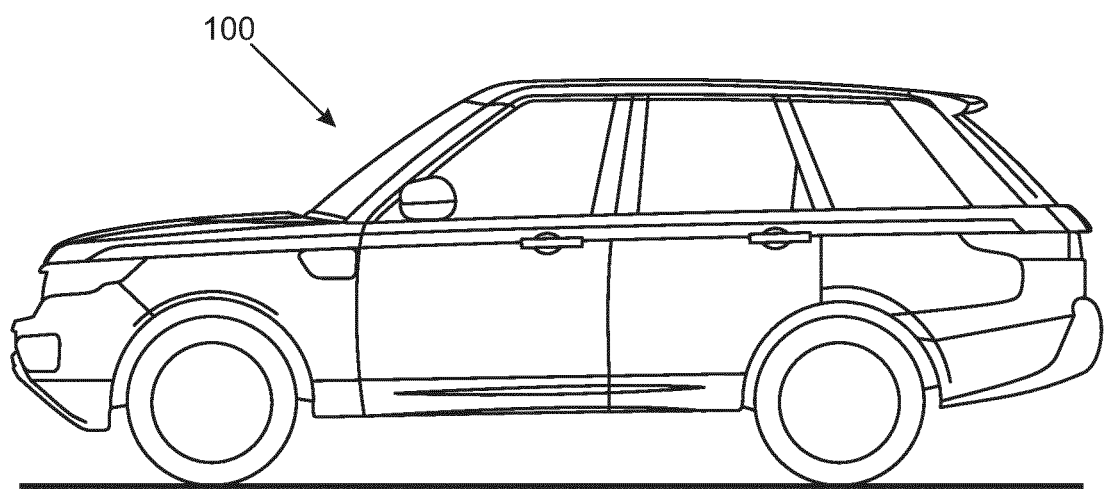
FIG. 1 illustrates a vehicle comprising a sun visor according to an embodiment of the present invention.
Figure 2:
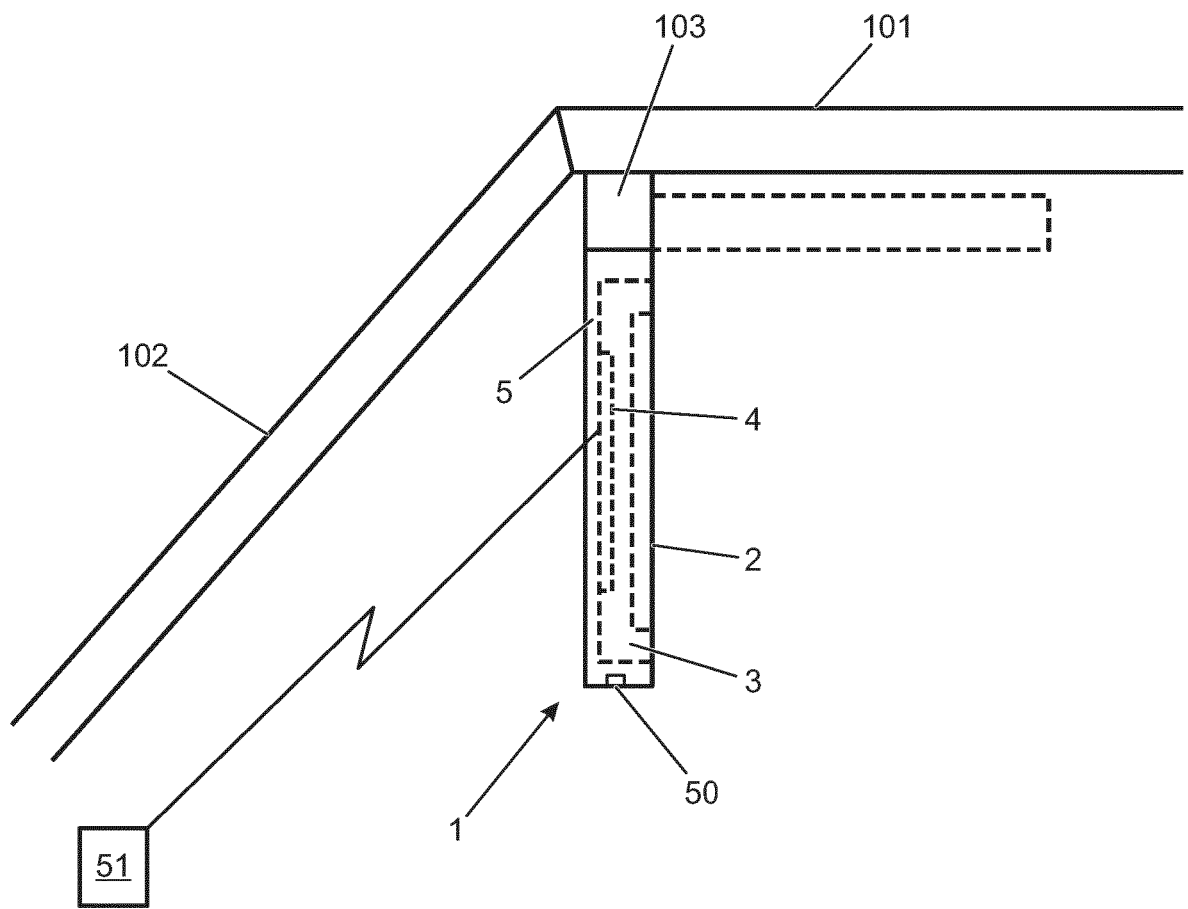
FIG. 2 illustrates a sun visor according to an embodiment of the present invention.

FIG. 1 illustrates a vehicle 100 comprising a deployable sun visor 1 in accordance with an embodiment of the present invention. The sun visor 1 is pivotally mounted to an interior of the roof 101 of the vehicle above the main windshield 102 in front of the driver's seat by a hinge 103, as illustrated in FIG. 2. The sun visor 1 is pivotable between a stowage position (indicated in dashed lines in FIG. 2) in which the sun visor 1 is adjacent to the interior of the roof of the vehicle 101 and a deployed position in which the visor is deployed from the interior of the roof vehicle 101 into a position in which glare through the windshield 102 is reduced (indicated with a solid line in FIG. 2) in a known manner.

The sun visor 1 comprises a large rectangular vanity mirror 2 on a first surface. The first surface is the surface that faces towards a user or the vehicle cabin when the sun visor is in the deployed position. The sun visor 1 also comprises a second surface. The second surface is the surface that faces towards a user or the vehicle cabin when the sun visor is in the stowage position. The sun visor 1 further comprises an integrated light emitting system 3 that is configured to provide lighting in the vehicle cabin around the mirror 2, as described below. The light emitting system 3 is illustrated in FIG. 3, in which the first surface and second surface covers of the sun visor 1 have been removed to expose the light emitting system 3, and in FIG. 4, which illustrates a cross section through a portion of the sun visor 1 at the location of the mirror 2.

Figure 4:
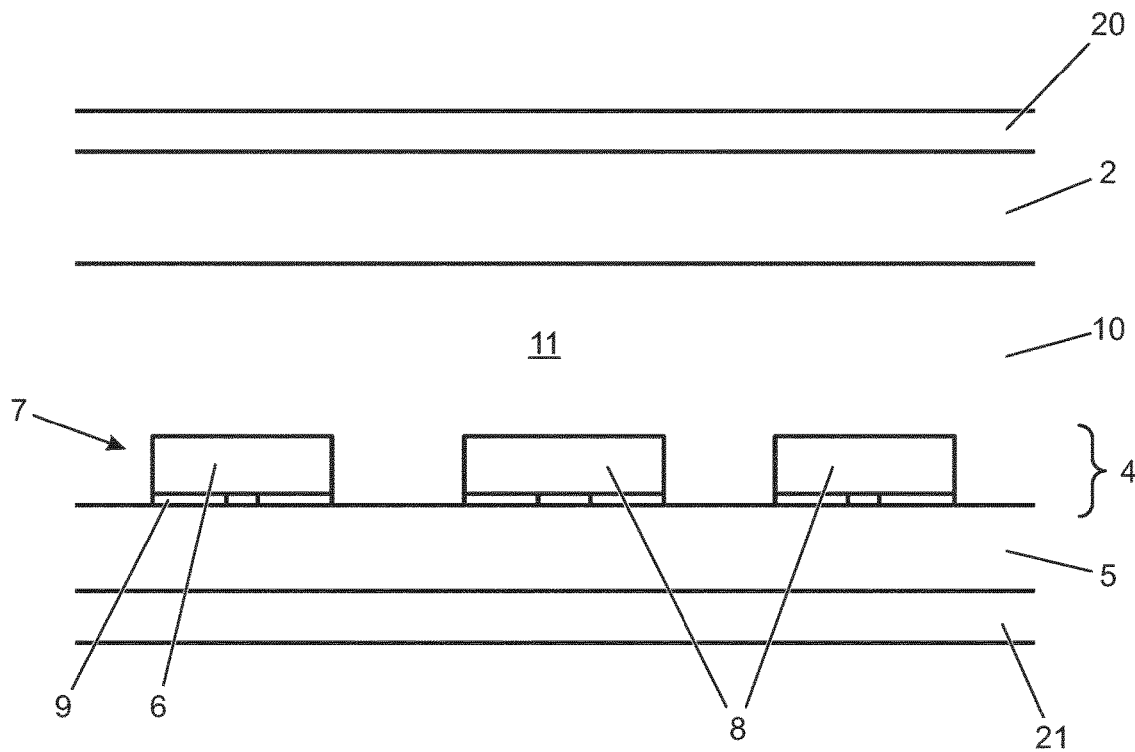
FIG. 4 illustrates a cross-section taken through a central portion of the sun visor of FIG. 2.

The light emitting system 3 comprises a printed electronic circuit or printed control module 4 formed by a plurality of electronic components 6, 8 printed on a structural substrate or component-carrying member 5 of the sun visor 1, as illustrated in part in FIG. 4. The printed electronic circuit 4 includes a plurality of printed LEDs 6 which are distributed across a plurality of locations on the substrate 5, and which together form a light source 7 of the light emitting system 3. The printed electronic circuit 4 also includes a plurality of further printed electronic components 8 that are configured to control operation of the LEDs 6 in order to control the lighting provided by the light emitting system 3. In particular, the printed electronic circuit 4 is able to switch on and off LEDs of different colours and at different locations in order to control the colour temperature, brightness, illuminance and distribution of lighting provided by the light emitting system 3. Underlying conductive prints or tracks 9 on the surface of the substrate 5 carry current to the components 6, 8 of the printed electronic circuit 4 as required.

For the avoidance of doubt, the printed electronic circuit 4 does not merely comprise a conventional printed circuit board (or PCB), which is generally a non-structural component. Rather, the printed electronic circuit as referred to herein comprises one or more electronic components formed by a printing process directly onto a structural component of the sun visor. Typically, the one or more electronic components comprise active and passive electronic components connected by printed tracks or wires. Typical passive components may comprise resistors, capacitors, inductors and transformers and diodes, whereas typical active components are those which act upon a source of current, such as amplifiers, switches, light emitting diodes (LEDs), integrated circuits, memories and microcontrollers. By printing the electronic circuit 4 onto a structural component 5 of the sun visor, the sun visor is provided with a simple, compact and rugged control system with a low parts count and reduced assembly time.

Figure 3:
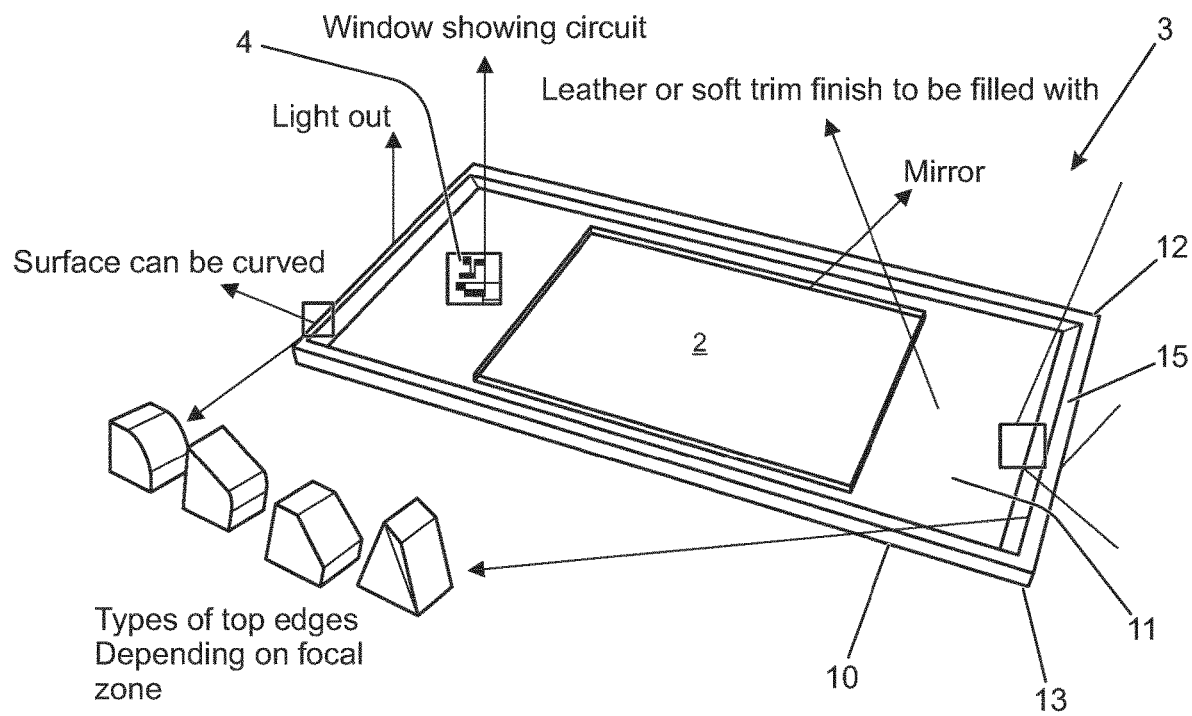
FIG. 3 illustrates the sun visor of FIG. 2 with the surface covers removed.

The light emitting system 3 further comprises a light dispersion device 10 for dispersing the light emitted by the LEDs 6 and transferring the light to the outside of the sun visor 1 to illuminate the near vicinity of the vehicle cabin, and the user's face in front of the mirror, as illustrated in FIG. 3. The light dispersion device 10 is typically formed of a polycarbonate material with high optical transmittance. The light dispersion device 10 comprises a sheet-like, substantially planar body portion 11 that extends across a majority of the area of the sun visor 1, and an outer bezel or light emission portion 12 that extends outwardly from the plane of the body portion 11 in a direction towards the first surface of the sun visor 1 continuously around the perimeter of the body portion 11. The light emission portion 12 is integrally formed with the body portion, and is joined to the body portion by a transition region 13.

The body portion 11 of the light dispersion device 10 is located directly adjacent to and extends across the substrate 5 and the printed electronic circuit 4, and the components 6, 8 of the printed electronic circuit 4 (including the LEDs 6) are embedded within the light dispersion device 10, as illustrated in FIG. 4. The body portion 11 of the light dispersion device 10 is configured to receive light emitted by the LEDs 6 when the LEDs are operated by the printed electronic circuit 4, and to transfer the light emitted by the LEDs 6 to the light emission portion 12 via the transition region 13. The LEDs 6 may be configured to emit light in a direction that is substantially parallel to the plane of the printed electronic circuit and the plane of the body portion in order to maximise the efficiency of transmission of light through the body portion 11. In some embodiments one or both sides of the body portion 11 may be provided with a reflective coating or a coating having a lower refractive index than the material of the light dispersion device in order to promote total internal reflection of light within the body portion 11 to further improve efficiency. In the present embodiment the LEDs 6 are spaced apart around the edges of the body portion 11 at locations adjacent to the light emission portion 12 and face towards the light emission portion 12, although in other embodiments the LEDs 6 may be provided at other locations, for example towards the centre of the body portion 11 of the light dispersion device 10.

Figure 5:
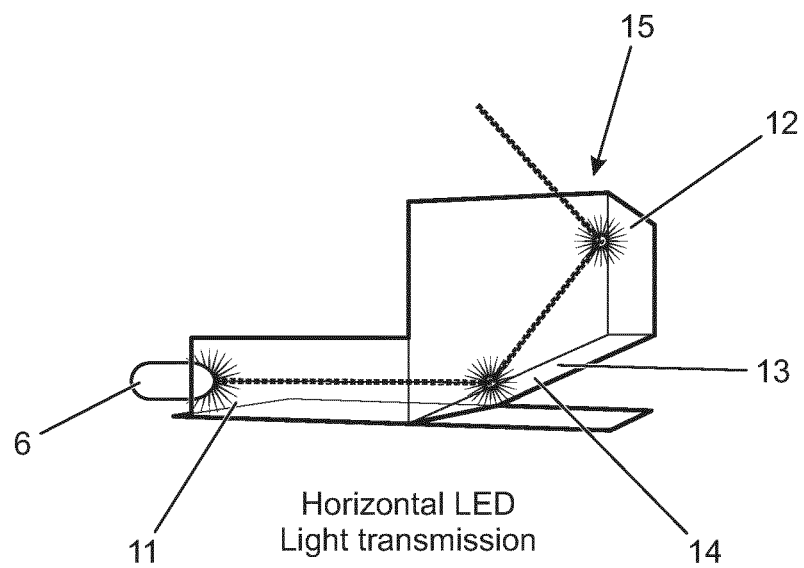
FIGS. 5 and 6 illustrate portions of a light dispersion device of the sun visor of FIG. 2.

The transition region 13 of the light dispersion device 10 has an angled shape, illustrated in FIG. 5, with an angle that is below the critical angle for light travelling through the light dispersion device 10 in order to avoid disrupting total internal reflection of light within the light dispersion device 10 and thereby maximise the efficiency of transmission of light from the body portion 11 to the light emission portion 12. In other embodiments the transition region 13 could alternatively have a curved shape, in which case the curvature may be selected to avoid disrupting total internal reflection. In addition, the transition region 13 may be provided with a reflective surface 14 (e.g. a mirror element or mirrored surface) for preventing leakage of light, in which case the angle or curvature of the transition region is less critical.

Figure 6:
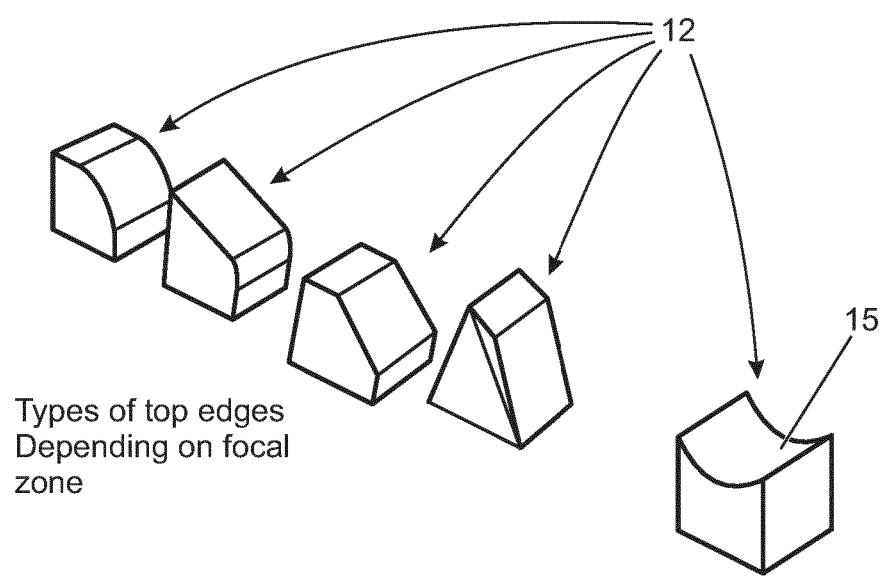

The light emission portion 12 of the light dispersion device 10 terminates in an end face 15 that faces away from the body portion 11 and towards the exterior of the sun visor 1. The light emission portion 12 is configured to act as a wave guide to guide light emitted by the LEDs 6 towards the first surface of the sun visor 1, and to transmit the light to the outside of the sun visor 1 through its end face 15 in order to provide illumination in the vehicle cabin. The end face 15 of the light emission portion 12 may be substantially planar, as illustrated in FIG. 3. Alternatively the end face 15 of the light emission portion 12 may have a profiled shape that is configured to act as a lens to focus light being transmitted to the outside of the sun visor 1, which may act to reduce any distraction caused by the light emitting system 3. For example, FIG. 6 illustrates, without limitation, various profile shapes for the light emission portion 12, including both curved and angular lens arrangements.

The light emission portion 12 of the light dispersion device 10 surrounds the mirror 2 in order to provide optimised lighting when a user looks into the mirror 2. The light emission portion 12 runs close to the outer edges of the sun visor 1 in order to minimise visual distraction caused by the light emitting system 3. The light dispersion device 10 acts to diffuse the light emitted by the LEDs 6 and to ensure comparatively uniform lighting from the sun visor 1 with minimised glare.

The first surface of the sun visor 1 is covered by a first surface cover 20. In one embodiment the first surface cover may comprise an electrochromic layer covering the mirror and/or the light dispersion device (including the end face of the light emission portion 12). The electrochromic layer 20 may be arranged to be controlled by the printed electronic circuit 4, and may be operable to hide or darken the mirror 2 when not in use and to hide the light dispersion device 10 when not in use. Other portions of the first surface (for example regions between the mirror and the light emission portion of the light dispersion device and outboard of the light emission portion of the light dispersion device) may be covered by leather or soft trim. The structural substrate 5 generally forms the rear cover of the sun visor 1, and is covered with an outer trim layer 21 that extends around the sides of the substrate 5 and the light dispersion device 10 to provide a rear presentation surface.

The sun visor 1 further includes a light sensor 50 (illustrated in FIG. 2) that is configured to detect the light conditions inside the vehicle 100, and to communicate the sensed light conditions to the printed electronic circuit 4. The printed electronic circuit 4 is also in communication with various external control systems located outside the sun visor 1, which are configured to communicate information related to the current use conditions of the sun visor 1 to the printed electronic circuit 4. These external control systems include a camera system or ISP (interior sensing platform) 51 including a dash-mounted, user-facing camera. The ISP 51 is configured to recognise a user sat in front of the sun visor 1, for example based on facial recognition information, and to communicate the identity of the user sat in front of the sun visor 1 to the printed electronic circuit 4. The ISP 51 is further configured to determine the skin tone, head position, face direction and eye direction of the user sat in front of the sun visor 1, and to communicate this information to the printed electronic circuit 4.

The printed electronic circuit 4 is configured to store user profiles including personal lighting preferences for different users of the vehicle 1 such that personalised lighting may be applied for a particular user as recognised by the ISP 51.

Operation of the printed electronic circuit 4 to control the lighting provided by the sun visor 1 will now be described.

Figure 7:
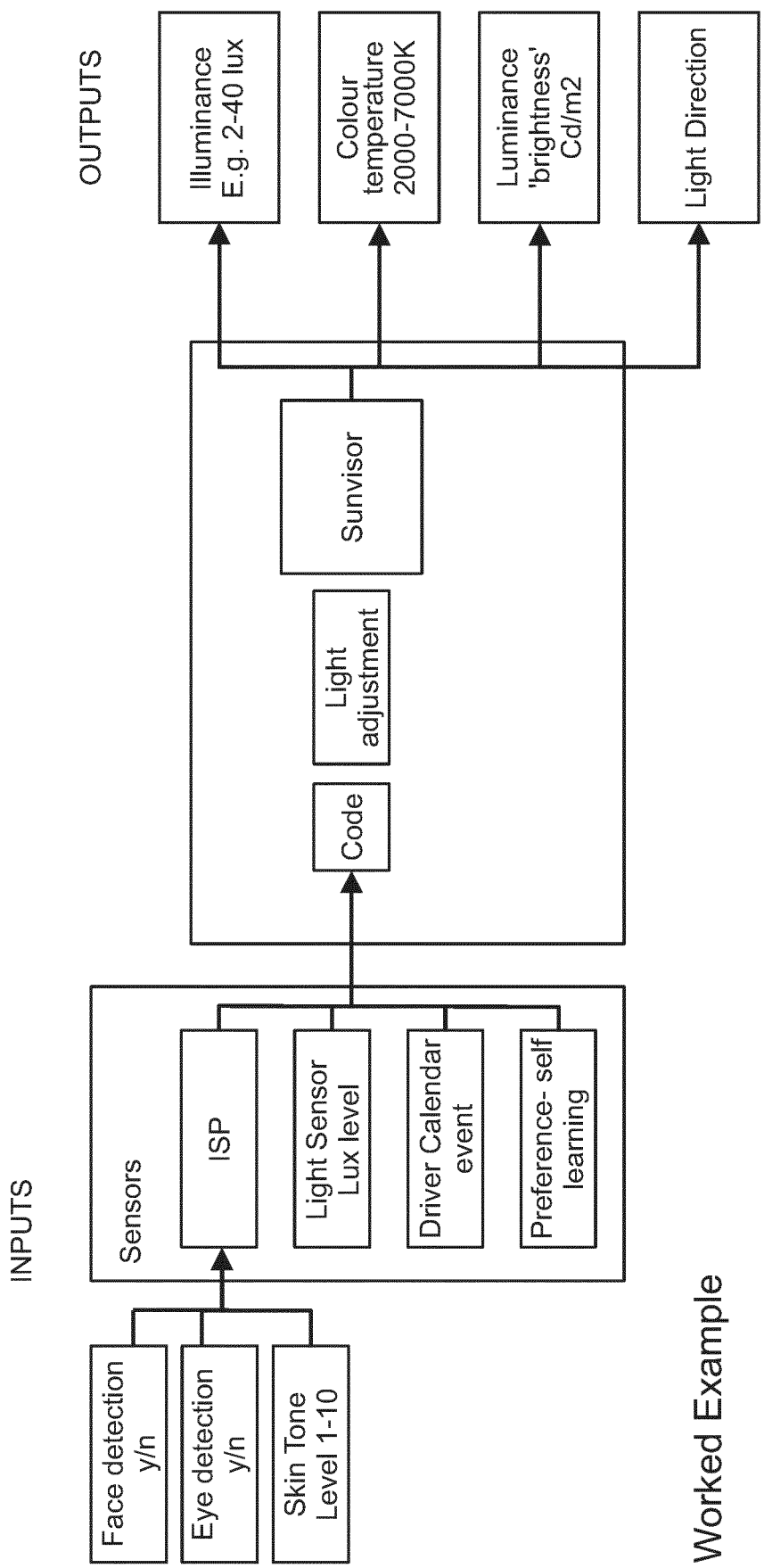
FIG. 7 illustrates control of the lighting provided by the sun visor in dependence on detected use conditions.

In use, the printed electronic circuit 4 receives information related to the light conditions inside the vehicle 1 from the light sensor 50, as schematically illustrated in FIG. 7. The printed electronic circuit 4 also receives the identity of the user sat in front of the sun visor 1 from the ISP 51, as well as information related to the skin tone, head position, face direction and eye direction of the user. Other information may also be received from other external control systems, including, for example information related to light conditions outside the vehicle 1, temperature inside the vehicle, temperature outside the vehicle, weather conditions, time, date, calendar event, vehicle location and planned destination. The printed electronic circuit 4 then uses the received information to determine the required lighting regime, including the required colour temperature, brightness, illuminance and distribution of lighting, for example by consulting one or more look-up tables stored in a memory module of the printed electronic circuit 4. The printed electronic circuit then controls the light source 7, for example by switching individual LEDs 6 on and off, in order to achieve the required lighting regime.

For example, the colour temperature, brightness and illuminance may be adjusted in dependence on the light conditions inside the vehicle 1 and the skin tone of the user sat in front of the sun visor 1 in order to provide familiar and accurate illumination of the user's face across a range of different ambient light conditions; and the distribution of lighting may be adjusted in dependence on the face shape, head position, face direction and eye direction of the user in order to accurately illuminate the desired areas of the user's face.

In this way, by considering a range of environmental and use factors, the sun visor 1, acting as a substantially self-contained system, is able to provide optimised lighting for a wide range of use conditions while taking into account the personal preferences of a particular user sat in front of the sun visor 1.

In some embodiments it may also be possible for a user to manually control the lighting provided by the sun visor 1. For example, the sun visor 1 may include one or more control elements such as physical or capacitive switches or a gesture detection device, and the printed electronic circuit 4 may be configured to switch the light source 7 on and off and to control the colour and/or intensity of light emitted by the light source 7 in dependence on a received command signal generated in response to operation of the control element(s) by a user of the vehicle 100. In some embodiments it may also be possible to control the lighting provided by the sun visor 1 using voice commands, in which case the sun visor 1 may include a microphone for receiving voice commands.

The printed electronic circuit 4 may also be configured to control the light source 7 to emit light at a reduced intensity or of a different colour compared to the light emitted while the vehicle 100 is stationary if it is detected that the vehicle is moving (or moving over a certain speed) in order to minimise visual distractions while the vehicle is being driven. In this case the printed electronic circuit 4 may be configured to receive information regarding the movement state of the vehicle 100 (for example confirmation of whether or not the vehicle is moving and/or an indication of current vehicle speed) either wirelessly or via a wired connection from another control module located in the vehicle. The printed electronic circuit 4 may also be configured to change the colour of light emitted by the light source 7 or to reduce the intensity of light emitted by the light source 7 if it is determined that a vehicle in front of the vehicle 100 to which the sun visor 1 is fitted has started to pull away while the vehicle to which the sun visor is fitted is stationary. The colour change or intensity reduction may act as a prompt to the driver about the change in the external conditions. Such a determination may be made in dependence on a parking sensor reading or the output from a camera mounted at the front of the vehicle 100, and may be communicated to the printed electronic circuit 4 either wirelessly or via a wired connection from another control module located in the vehicle 100.

The printed electronic circuit 4 may also be configured to control the light source 7 to emit light into the vehicle cabin to illuminate features of the cabin or items brought into the cabin by the occupants e.g. books, magazines, e-readers, games. In an embodiment, when the task lighting mode is switched on, the printed electronic circuit 4 is arranged to switch off any or all colour adjustments to provide substantially white light. In the event that the sun visor comprises a plurality of the light emission portions, the printed electronic circuit 4 is arranged to switch on all of the light emission portions. If the sun visor comprises an electrochromic cover disposed over the vanity mirror, then the printed electronic circuit is arranged to control the electrochromic cover so as to hide the vanity mirror from view during the task light mode. If the sun visor comprises an electrochromic cover disposed over the light dispersion device and/or the light emission portion, then the printed electronic circuit is arranged to control the electrochromic cover so as to reveal the light dispersion device and/or the light emission portion during the task light mode. The task light mode of operation may be activated or deactivated automatically in dependence on an angle or deployment of the sun visor. In an embodiment, the task light mode of operation is automatically activated when the sun visor is deployed to a predefined position, e.g. proximal to the windscreen or unclipped and arranged proximal to a door window.

The printed electronic circuit 4 may also be configured to automatically switch the light source 7 on to thereby provide illumination from the sun visor 1 when it is detected that the sun visor 1 has been moved out of the stowage position by a predetermined distance. Deployment of the sun visor 1 may be detected, for example, using a sensor located in the hinge 103 of the sun visor 1 that is in communication with the printed electronic circuit 4. In addition, the printed electronic circuit 4 may be configured to control the light source 7 to emit light while the sun visor 1 is in the stowage position adjacent to the interior of the roof 101 of the vehicle 100, for example during low light conditions, in order to provide ambient lighting within the vehicle cabin.

It will be appreciated that the above-described control modes are only examples, and that the printed electronic circuit 4 may be configured to control the lighting provided by the sun visor in different ways in other embodiments of the present invention.

Manufacture of the sun visor 1 will now be described.

The structural substrate or component-carrying member 5 is first manufactured as a separate component, for example using an injection moulding process. The components 6, 8 of the printed electronic circuit 4 are then printed directly onto the inwardly-facing surface of the substrate 5, for example using a screen printing process. The light dispersion device 10 is then moulded, for example injection moulded, directly onto the inwardly-facing surface of the substrate 5 (which acts as a moulding surface for forming the light dispersion device 10). Since the printed electronic circuit 4 has already been formed on the substrate 5 the light dispersion device 10 is also moulded directly onto the various components 6, 8 of the printed electronic circuit 4, which become embedded in the light dispersion device 10. Depending on the choice of materials and moulding conditions, the substrate 5 and the light dispersion device 10 may fuse together during the moulding process to form a single unitary structure with the components 6, 8 of the printed electronic circuit 4 suspended within the structure. The remaining elements of the sun visor 1, including the mirror 2, the first surface cover 20 and the outer trim layer 21, may then be assembled together with the substrate 5 and the light dispersion device 10 to complete the sun visor 1.

Many modifications may be made to the above examples without departing from the scope of the present invention as defined in the accompanying claims.

For example, in the above-described embodiment the light dispersion device 10 comprises a continuous, sheet-like body portion 11 that extends across the entire printed electronic circuit 4 and is configured to receive light emitted by the light source 7. However, in other embodiments the body portion 11 may not be continuous and need not extend across the entire printed electronic circuit 4. For example, the body portion 11 could instead include a central aperture and extend only around an outer portion of the printed electronic circuit 4 adjacent to the light emission portion 12. In other embodiments the LEDs 6 could alternatively be located directly under the light emission portion 12 or bezel of the light dispersion device 10, in which case the body portion 11 and the transition portion 12 of the light dispersion device 10 may optionally be omitted altogether. In this case the LEDs 6 are preferably configured to emit light into the light emission portion 12 in a direction perpendicular to the plane of the printed electronic circuit 4.

In addition, in the above-described embodiment the sun visor 1 comprises a single light dispersion device 10 including a single light emission portion 12 in the form of a bezel extending continuously around the sun visor 1 for transmitting light into the vehicle cabin. However, in other embodiments the light emitting portion 12 of the light dispersion device 10 may have a different shape or be provided at a different location on the sun visor 1. In addition, the light dispersion device 10 could alternatively include multiple separate (unconnected) light emission portions 12, and/or the sun visor 1 may include multiple separate light dispersion devices 10 each providing their own respective light emission portion(s).

The above description relates generally to a single sun visor 1 located on the driver's side of a vehicle 100. However, it will be appreciated that a vehicle 100 may include multiple sun visors 1 in accordance with the present invention, each of which may comprise its own respective light source 7 that is controllable by its own respective printed electronic circuit 4. In one particular embodiment a sun visor 1 is located on each of the driver side of the vehicle and the passenger side of the vehicle.

The invention claimed is:

1. A sun visor for a vehicle, comprising:
a sun visor structural component;
a light source; and
at least one electronic component for controlling lighting provided by the sun visor,
wherein the at least one electronic component is a printed electronic component that is printed directly on the sun visor structural component, and
wherein the printed electronic component is configured to receive information related to a current use condition of the sun visor from a control system located outside of the sun visor and to control the lighting provided by the sun visor in dependence of the received information.

2. A sun visor according to claim 1, wherein the light source includes at least one light emitting element that is printed on the sun visor structural component of the sun visor.

3. A sun visor according to claim 1, wherein the sun visor structural component is a cover of the sun visor.

4. A sun visor according to claim 1, wherein the sun visor comprises a light dispersion device configured to disperse light emitted by the light source.

5. A sun visor according to claim 4, wherein the light dispersion device is molded directly onto at least one of the sun visor structural component, the light source, and the at least one electronic component.

6. A sun visor according to claim 4, wherein the light dispersion device comprises at least one of a body portion that is configured to receive light emitted by the light source and a light emission portion that is configured to transmit light emitted by the light source to outside of the sun visor.

7. A sun visor according to claim 6, wherein the body portion of the light dispersion device is at least substantially sheet like or located adjacent to the sun visor structural component, the light source and the at least one electronic component.

8. A sun visor according to claim 6, wherein the light emission portion of the light dispersion device is at least one of integrally formed with the body portion, joined to the body portion by a transition region, and located at or adjacent to at least one edge of the sun visor.

9. A sun visor according to claim 6, wherein the light emission portion of the light dispersion device forms a loop extending around the sun visor.

10. A sun visor according to claim 6, wherein the light emission portion of the light dispersion device extends along at least one edge of the body portion.

11. A sun visor according to claim 1, wherein the at least one electronic component is configured to control lighting provided by the sun visor in dependence on one or more of: light conditions inside the vehicle, light conditions outside the vehicle, temperature inside the vehicle, temperature outside the vehicle, weather conditions, time, date, calendar event, vehicle location and planned destination.

12. A sun visor according to claim 1, wherein the at least one electronic component is configured to control lighting provided by the sun visor in dependence on one or more of vehicle occupancy, a user selected setting and a movement state of the vehicle.

13. A sun visor according to claim 1, wherein the at least one electronic component is configured to control lighting provided by the sun visor in dependence on at least one of skin tone, head position, face direction, eye direction and face shape of a user.

14. A sun visor according to claim 1, wherein the at least one electronic component is configured to control lighting provided by the sun visor in dependence on at least one of detected movement of another vehicle in front of the vehicle and a detected change in a traffic light state.

15. A sun visor according to claim 1, wherein the sun visor is configured to provide ambient lighting within a cabin of the vehicle while in a stowage position adjacent to a roof of the vehicle.

16. A vehicle comprising a sun visor according to claim 1.

17. A sun visor according to claim 1, wherein the printed electronic component is arranged to receive information about a user sitting in front of the sun visor from the control system comprising an interior sensing platform (ISP) configured to determine the information about the user in front of the sun visor.

18. A method of manufacturing a sun visor for a vehicle, the sun visor comprising a light source and a sun visor structural component, the method comprising printing at least one electronic component directly on the sun visor structural component, wherein the printed electronic component is configured to control lighting provided by the sun visor, receive information related to a current use condition of the sun visor from a control system located outside of the sun visor, and control lighting provided by the sun visor in dependence on the received information.

19. A method according to claim 18, comprising printing at least one light emitting element forming part of a light source on the sun visor structural component.

20. A method according to claim 18, comprising molding a light dispersion device for dispersing light emitted by a light source of the sun visor directly onto at least one of the sun visor structural component, the at least one electronic component, and the light source.

* * * * *